(12) United States Patent
Lee et al.

(10) Patent No.: US 9,164,835 B2
(45) Date of Patent: Oct. 20, 2015

(54) OPERATING METHOD OF CONTROLLER CONTROLLING NONVOLATILE MEMORY DEVICE AND MAPPING PATTERN SELECTING METHOD OF SELECTING MAPPING PATTERN MAPPING POLAR CODED CODE WORD WITH MULTI BIT DATA OF NONVOLATILE MEMORY DEVICE

(71) Applicants: SAMSUNG ELECTRONICS CO., LTD., Suwon-si, Gyeonggi-do (KR); POSTECH ACADEMY-INDUSTRY FOUNDATION, Gyeongsangbuk-do (KR)

(72) Inventors: Kijun Lee, Seoul (KR); Dong-Min Shin, Pohang-si (KR); Kyeongcheol Yang, Pohang-si (KR); Seung-Chan Lim, Pohang-si (KR); Junjin Kong, Yongin-si (KR); Myungkyu Lee, Hwaseong-si (KR)

(73) Assignees: SAMSUNG ELECTRONICS CO., LTD., Suwon-Si, Gyeonggi-Do (KR); POSTECH ACADEMY-INDUSTRY FOUNDATION, Pohang-Si, Gyeongsangbuk-Do (KR)

( * ) Notice: Subject to any disclaimer, the term of this patent is extended or adjusted under 35 U.S.C. 154(b) by 161 days.

(21) Appl. No.: 13/801,297

(22) Filed: Mar. 13, 2013

(65) Prior Publication Data

US 2013/0283128 A1 Oct. 24, 2013

(30) Foreign Application Priority Data

Apr. 19, 2012 (KR) ........................ 10-2012-0040909

(51) Int. Cl.
*G06F 11/10* (2006.01)
*G11C 7/10* (2006.01)
(Continued)

(52) U.S. Cl.
CPC ........ *G06F 11/1068* (2013.01); *G06F 11/1072* (2013.01); *G11C 7/1006* (2013.01);
(Continued)

(58) Field of Classification Search
CPC ............. G11C 16/0483; G11C 7/1006; G11C 11/5628; G11C 29/56008; G11C 2211/5641; G11C 29/56004; G06F 11/1068; G06F 11/1072; H03M 13/13
USPC .................................. 714/763, 773; 711/102
See application file for complete search history.

(56) References Cited

U.S. PATENT DOCUMENTS

2009/0276687 A1* 11/2009 Kim et al. ...................... 714/777
2009/0282316 A1 11/2009 Lingam et al.
(Continued)

OTHER PUBLICATIONS

E. Arikan, "Channel Polarization: A method for Constructing Capacity Achieving Codes for Symmetric Binary-Input Memoryless Channels," IEEE Trans. Inform. Theory, vol. 55, pp. 3051-3073 (2009).*
(Continued)

*Primary Examiner* — Guy Lamarre
(74) *Attorney, Agent, or Firm* — F. Chau & Associates, LLC

(57) ABSTRACT

An operating method of a nonvolatile memory device controller includes generating a code word through polar encoding of information bits, reading a mapping pattern, generating a repeated mapping pattern through iteration of the mapping pattern, and mapping each bit of the code word onto a specific bit of multi-bit data of the nonvolatile memory device, based upon the repeated mapping pattern.

8 Claims, 18 Drawing Sheets

(51) Int. Cl.
  *H03M 13/13* (2006.01)
  *G11C 29/56* (2006.01)
  *G11C 16/04* (2006.01)
  *G11C 11/56* (2006.01)

(52) U.S. Cl.
  CPC .... *G11C29/56004* (2013.01); *G11C 29/56008* (2013.01); *H03M 13/13* (2013.01); *G11C 11/5628* (2013.01); *G11C 16/0483* (2013.01); *G11C 2211/5641* (2013.01)

(56) References Cited

U.S. PATENT DOCUMENTS

2009/0292972 A1  11/2009  Seol et al.
2009/0292973 A1  11/2009  Seol et al.
2011/0243557 A1  10/2011  Croussore et al.
2014/0019820 A1* 1/2014  Vardy et al. ............... 714/752

OTHER PUBLICATIONS

E. Arikan et al. "On the Rate of Channel Polarization," in Proc. IEEE Int'l Symp. Inform. Theory, Seoul, South Korea, pp. 1493-1495 (2009).*

Hyun-Koo Yang, et al. "Optimization of Degree-Profile Matching Interleavers for LDPC-coded Modulation," IEEE Communications Letters, vol. 10, No. 12, Dec. 2006.

Yan Li, et al., "Bit-Reliability Mapping in LDPC-Coded Modulation Systems," IEEE Communications Leters vol. 9, No. 1, Jan. 2005.

* cited by examiner

Fig. 6

| Number of bits stored in a memory cell | Length of word | Possible number of patterns | Possible patterns |
|---|---|---|---|
| 2 Bits | 2 bits | 2 patterns | (LSB, MSB), (MSB, LSB) |
| | 4 bits | 6 patterns | (MSB, MSB, LSB, LSB), (MSB, LSB, MSB, LSB), (MSB, LSB, LSB, MSB), (LSB, MSB, MSB, LSB), (LSB, MSB, LSB, MSB), (LSB, LSB, MSB, MSB) |
| | n bits | $\dfrac{n!}{\left(\left(\dfrac{n}{2}\right)!\right)^2}$ Patterns | |
| m Bits | n bits | $\dfrac{n!}{\left(\left(\dfrac{n}{m}\right)!\right)^m}$ Patterns | |

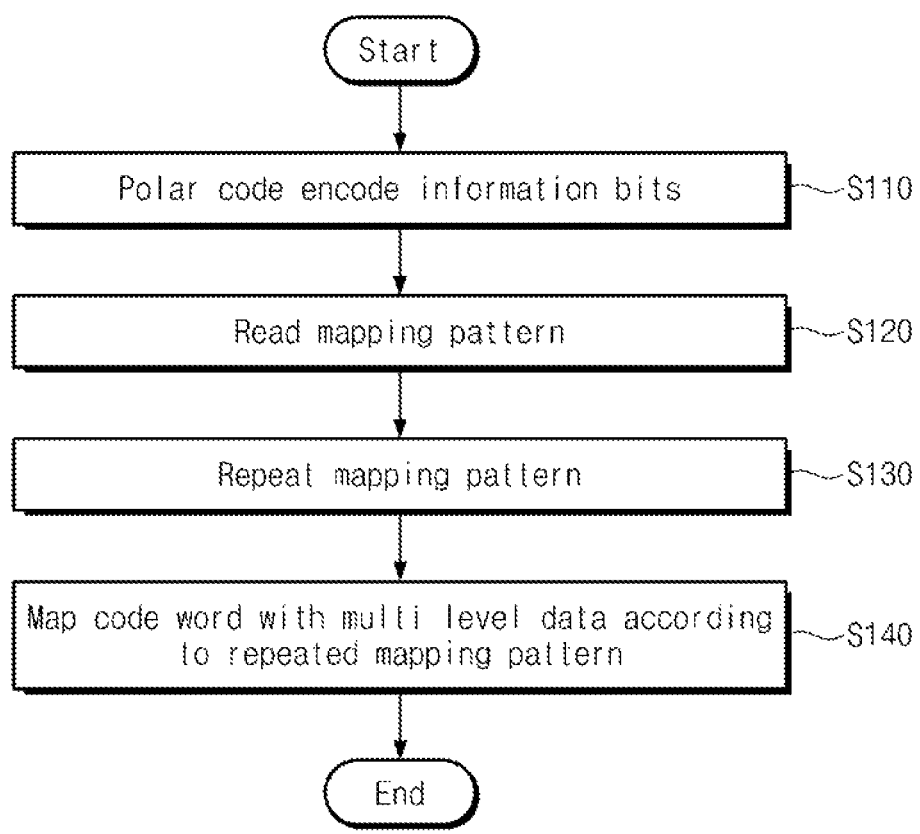

| Code Word | 100110011011 |
|---|---|
| Pattern | LSB, CSB, MSB, CSB, MSB, LSB |
| Repeated Pattern | LSB, CSB, MSB, CSB, MSB, LSB, LSB, CSB, MSB, CSB, MSB, LSB |
| S1 (LSB Mapped) | 1, 6, 7, 12 |
| S2 (CSB Mapped) | 2, 4, 8, 10 |
| S3 (MSB Mapped) | 3, 5, 9, 11 |
| Coded LSB Data | 1001 |
| Coded CSB Data | 0110 |
| Coded MSB Data | 0111 |

OPERATING METHOD OF CONTROLLER CONTROLLING NONVOLATILE MEMORY DEVICE AND MAPPING PATTERN SELECTING METHOD OF SELECTING MAPPING PATTERN MAPPING POLAR CODED CODE WORD WITH MULTI BIT DATA OF NONVOLATILE MEMORY DEVICE

CROSS-REFERENCE TO RELATED APPLICATION

This application claims under 35 U.S.C. §119 priority to and the benefit of Korean Patent Application No. 10-2012-0040909 filed on Apr. 19, 2012 in the Korean Intellectual Property Office, the entire contents of which are incorporated by reference herein.

BACKGROUND

1. Technical Field

The present disclosure relates to a semiconductor memory device, and more particularly, relates to an operating method of a controller for controlling a nonvolatile memory device and a mapping pattern selecting method for selecting a mapping pattern mapping a polar coded code word onto multi-bit data of the nonvolatile memory device.

2. Discussion of Related Art

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

The volatile memory devices may lose stored contents at power-off. The volatile memory devices include various random access memory (RAM) devices, such as a static random access memory (SRAM), a dynamic RAM (DRAM), a synchronous DRAM (SDRAM), and the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like. The flash memory device is roughly divided into a NOR type and a NAND type.

Polar encoding has recently been introduced as a low-complexity coding scheme for a large class of channels. Polar encoding typically represents bits by using two levels of polarity or amplitude: positive and negative. A common type is polar encoding is Non Return to Zero (NRZ). With NRZ the level of signal is determined by the binary digit being sent. Binary 1's are indicated by positive voltages and binary 0's by negative voltages. However, a need exists for a method and apparatus configured to control nonvolatile memory devices using polar encoding.

SUMMARY

Exemplary embodiments of the inventive concept provide an operating method of a memory controller configured to control a nonvolatile memory device. The operating method includes generating a code word through polar encoding of information bits, reading a mapping pattern, generating a repeated mapping pattern through iteration of the mapping pattern, and mapping each bit of the code word onto a specific bit of multi-bit data of the nonvolatile memory device, based upon the repeated mapping pattern.

In an exemplary embodiment, the length of the repeated mapping pattern may be equal to the length of the code word.

In an exemplary embodiment, mapping each bit of the code word onto a specific bit of multi-bit data of the nonvolatile memory device may include mapping each bit of the code word onto a least significant bit or a most significant bit according to the repeated mapping pattern.

In an exemplary embodiment, the mapping each bit of the code word onto a specific bit of multi-bit data of the nonvolatile memory device may include mapping each bit of the code word onto a least significant bit, a central significant bit, or a most significant bit according to the repeated mapping pattern.

In an exemplary embodiment, the operating method may further include transferring the mapped code word as multi-bit write data to the nonvolatile memory device.

In an exemplary embodiment, the operating method may further include receiving multi-bit read data from the nonvolatile memory device, converting the multi-bit read data into a read code word based upon the repeated mapping pattern, and decoding the read code word.

In an exemplary embodiment, the operating method may further include performing error correction encoding on the mapped code word, and transferring the encoded code word as multi-bit write data to the nonvolatile memory device.

In an exemplary embodiment, the operating method may further include receiving multi-bit read data from the nonvolatile memory device, performing error correction decoding on the multi-bit read data, converting the decoded multi-bit read data into a read code word based upon the repeated mapping pattern, and decoding the read code word.

Exemplary embodiments of the inventive concept also provide a method of selecting a mapping pattern used to map a polar coded code word onto multi bits of a nonvolatile memory device, the method including generating a plurality of patterns, generating a plurality of repeated patterns via iteration of each of the plurality of patterns, calculating error rates of the plurality of repeated patterns, and selecting one of the plurality of repeated patterns according to the calculated error rates.

In an exemplary embodiment, the calculating of error rates may be performed based upon probability density functions of the multi bits.

In an exemplary embodiment, the calculating of error rates may include calculating error rates of bits of an input stage of a polar encoder based upon the probability density functions of the multi bits.

In an exemplary embodiment, at least one of error rates of bits of an input stage of the polar encoder may exceed a reference value, a corresponding repeated pattern being not selected.

In an exemplary embodiment, a repeated pattern having a lowest average of error rates of bits of an input stage of the polar encoder may be selected.

In an exemplary embodiment, the method may further include storing a pattern corresponding to the selected repeated pattern at a controller controlling a nonvolatile memory device.

In an exemplary embodiment, the length of the repeated pattern may be equal to the length of the polar coded code word.

Exemplary embodiments of the inventive concept also provide a method of transferring data between a host and a nonvolatile memory device in response to a request from the host to a memory controller configured to control a read operation and a write operation, the method including: upon receiving write operation data from the host, the memory controller writing coded data to the nonvolatile memory device by performing polar code encoding on data input from the host and mapping bits of a polar coded code word onto multi-bit data such that polar code word bits mapped onto the most significant bits are written to the nonvolatile memory device as most significant bits, polar code word bits mapped onto the central significant bits are written to the nonvolatile memory device as central significant bits, and polar code word bits mapped onto the least significant bits are written at the nonvolatile memory device as least significant bits, and upon receiving read operation coded data from the nonvolatile memory device, the memory controller restores data for the host by polar code decoding on data input from the nonvolatile memory device through remapping of least significant bits, central significant bits, and most significant bits read from the nonvolatile memory device.

In an exemplary embodiment, when one memory cell of the nonvolatile memory device is configured to store 2-bit data and a code word has a length of two bits, the code word may be mapped onto multi-bit data such that: a first bit of the code word is mapped onto a least significant bit, and a second bit thereof is mapped onto a most significant bit, or a first bit of the code word is mapped onto a most significant bit, and a second bit thereof is mapped onto a least significant bit.

In an exemplary embodiment, when one memory cell of the nonvolatile memory device is configured to store 2-bit data and a code word has a length of four bits, the code word may be mapped onto multi-bit data such that: (1) a first bit of the code word may be mapped onto a most significant bit, a second bit thereof may be mapped onto a least significant bit, a third bit of the code word may be mapped onto a most significant bit, and a fourth bit thereof may be mapped onto a least significant bit, or (2) a first bit of the code word is mapped onto a most significant bit, a second bit thereof is mapped onto a least significant bit, a third bit of the code word is mapped onto a least significant bit, and a fourth bit thereof is mapped onto a most significant bit, or (3) a first bit of the code word is mapped onto a least significant bit, a second bit thereof is mapped onto a most significant bit, a third bit of the code word is mapped onto a most significant bit, and a fourth bit thereof is mapped onto a most significant bit, or (4) a first bit of the code word is mapped onto a least significant bit, a second bit thereof is mapped onto a least significant bit, a third bit of the code word is mapped onto a most significant bit, and a fourth bit thereof is mapped onto a most significant bit, or (5) a first bit of the code word is mapped onto a least significant bit, a second bit thereof is mapped onto a most significant bit, a third bit of the code word is mapped onto a most significant bit, and a fourth bit thereof is mapped onto a least significant bit.

In an exemplary embodiment, when one memory cell is configured to store 2-bit data and a code word has an n-bit length, the code word may be mapped onto multi-bit data according to one of patterns calculated using the following equation:

$$n!/\left(\left(\frac{n}{2}\right)!\right)^2$$

In an exemplary embodiment, when one memory cell stores m-bit data and a code word has an n-bit length, the code word may be mapped onto multi-bit data according to one of patterns calculated using the following equation:

$$n!/\left(\left(\frac{n}{m}\right)!\right)^m$$

BRIEF DESCRIPTION OF THE DRAWINGS

The exemplary embodiments will now be described with reference to the following figures, wherein like reference numerals refer to like parts throughout the various figures unless otherwise specified.

FIG. 6 is a table illustrating an example that a code word is mapped onto multi-bit data through a polar code encoder/decoder.

FIG. 7 is a flowchart illustrating an operating method of a controller according to an exemplary embodiment of the inventive concept.

DETAILED DESCRIPTION

Figure 1:
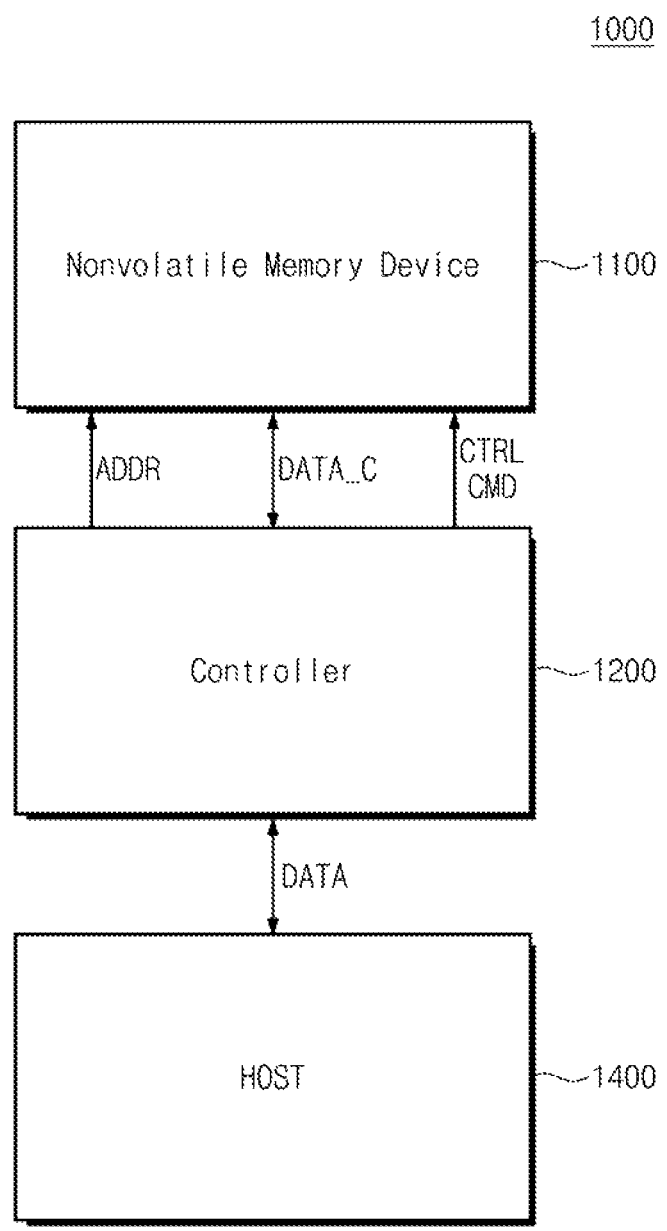
FIG. 1 is a block diagram schematically illustrating a memory system according to an exemplary embodiment of the inventive concept.

Embodiments will be described in detail with reference to the accompanying drawings. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

FIG. 1 is a block diagram schematically illustrating a memory system according to an exemplary embodiment of the inventive concept. Referring to FIG. 1, a memory system 1000 may include a nonvolatile memory device 1100 and a controller 1200.

The controller 1200 may be connected with a host 1400 and the nonvolatile memory device 1100. In response to a request from the host 1400, the controller 1200 may be configured to access the nonvolatile memory device 1100. For example, the controller 1200 may be configured to control a read operation, a write operation, an erase operation, a read operation, and a background operation of the nonvolatile memory device 1100. The controller 1200 may be configured to provide an interface between the nonvolatile memory device 1100 and the host 1400. The controller 1200 may be configured to drive firmware for controlling the nonvolatile memory device 1100.

The controller 1200 may receive data from the host 1400. The controller 1200 may encode the input data to generate coded data DATA_C. The controller 1200 may be configured to provide the nonvolatile memory device 1100 with a control signal CTRL, a command CMD, and an address ADDR. The controller 1200 may be configured to exchange coded data DATA_C with the nonvolatile memory device 1100. The controller 1200 may be configured to restore data by decoding coded data DATA_C input from the nonvolatile memory device 1100. The controller 1200 may provide the restored data to the host 1400.

Figure 2:
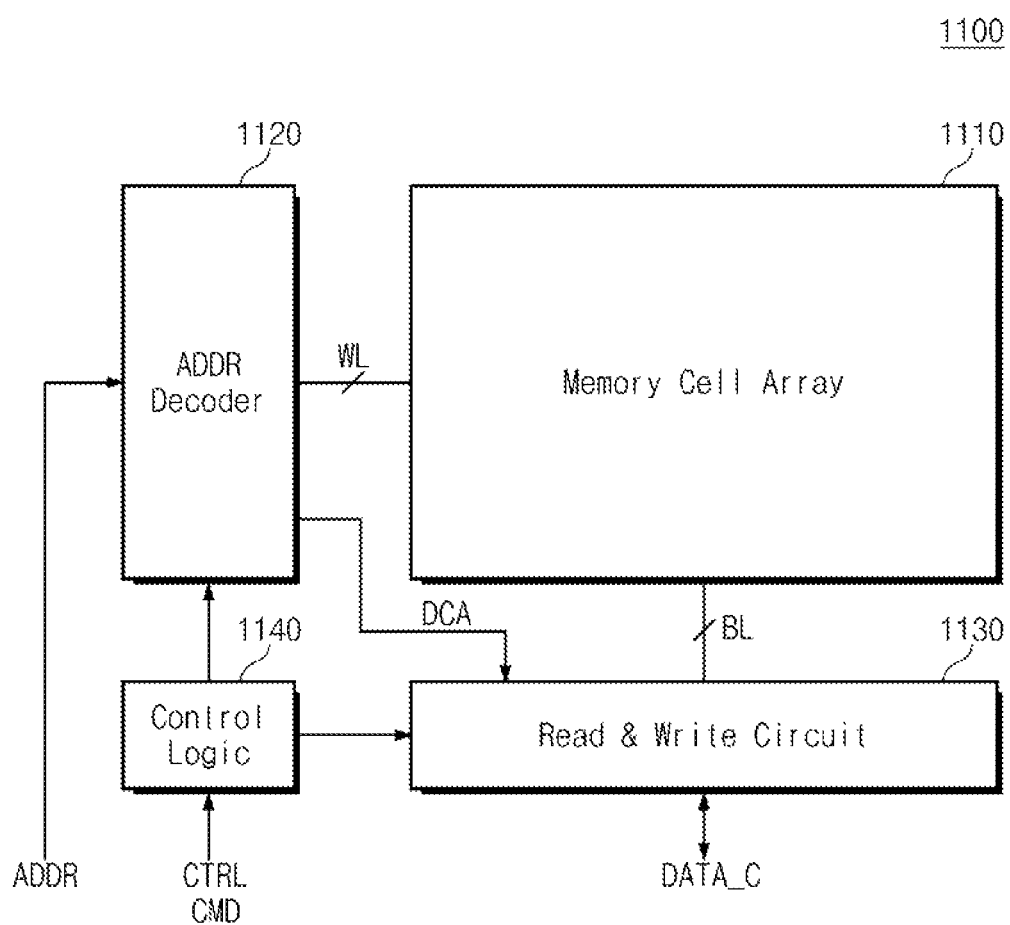
FIG. 2 is a block diagram schematically illustrating a nonvolatile memory device according to an exemplary embodiment of the inventive concept.

FIG. 2 is a block diagram schematically illustrating a nonvolatile memory device according to an exemplary embodiment of the inventive concept. Referring to FIG. 2, a nonvolatile memory device 1100 according to an exemplary embodiment of the inventive concept may include a memory cell array 1110, an address decoder 1120, a read/write circuit 1130, and control logic 1140.

The memory cell array 1110 may be connected to the address decoder 1120 via word lines WL and to the read/write circuit 1130 via bit lines BL. The memory cell array 1110 may include a plurality of memory cells. In exemplary embodiments, memory cells arranged in a row direction may be connected to word lines WL, and memory cells arranged in a column direction may be connected to bit lines BL. For example, memory cells arranged in a column direction may form a plurality of cell groups (e.g., strings) that are connected to the bit lines, respectively. In exemplary embodiments, the memory cell array 1110 may include multiple memory cells each storing one or more bits of data.

The address decoder 1120 may be connected to the memory cell array 1110 via the word lines WL. The address decoder 1120 may operate responsive to the control of the control logic 1140.

The address decoder 1120 may decode a row address of an input address ADDR, and may select the word lines WL in response to the decoded row address. The address decoder 1120 may decode a column address of the input address ADDR and transfer it as decoded column address DCA to the read/write circuit 1130. In exemplary embodiments, the address decoder 1120 may include constituent elements such as a row decoder, a column decoder, an address buffer, and the like.

The read/write circuit 1130 may be coupled with the memory cell array 1110 via bit lines BL. The read/write circuit 1130 may be configured to exchange data with an external device. The read/write circuit 1130 may operate responsive to the control of the control logic 1140. The read/write circuit 1130 may select bit lines BL in response to the decoded column address DCA provided from the address decoder 1120.

In exemplary embodiments, the read/write circuit 1130 may receive coded data DATA_C from an external device and write it in the memory cell array 1110. The read/write circuit 1130 may read coded data DATA_C from the memory cell array 1110 and output it to the external device. The read/write circuit 1130 may read data from a first storage area of the memory cell array 1110 and write it in a second storage area thereof. That is, the read/write circuit 1130 may perform a copy-back operation.

In exemplary embodiments, the read/write circuit 1130 may include constituent elements such as a page buffer (or, a page register), a column selecting circuit, a data buffer, and the like. In other exemplary embodiments, the read/write circuit 1130 may include constituent elements such as a sense amplifier, a write driver, a column selecting circuit, a data buffer, and the like.

The control logic 1140 may be coupled with the address decoder 1120 and the read/write circuit 1130. The control logic 1140 may be configured to control the overall operation of the nonvolatile memory device 1100.

Figure 3:
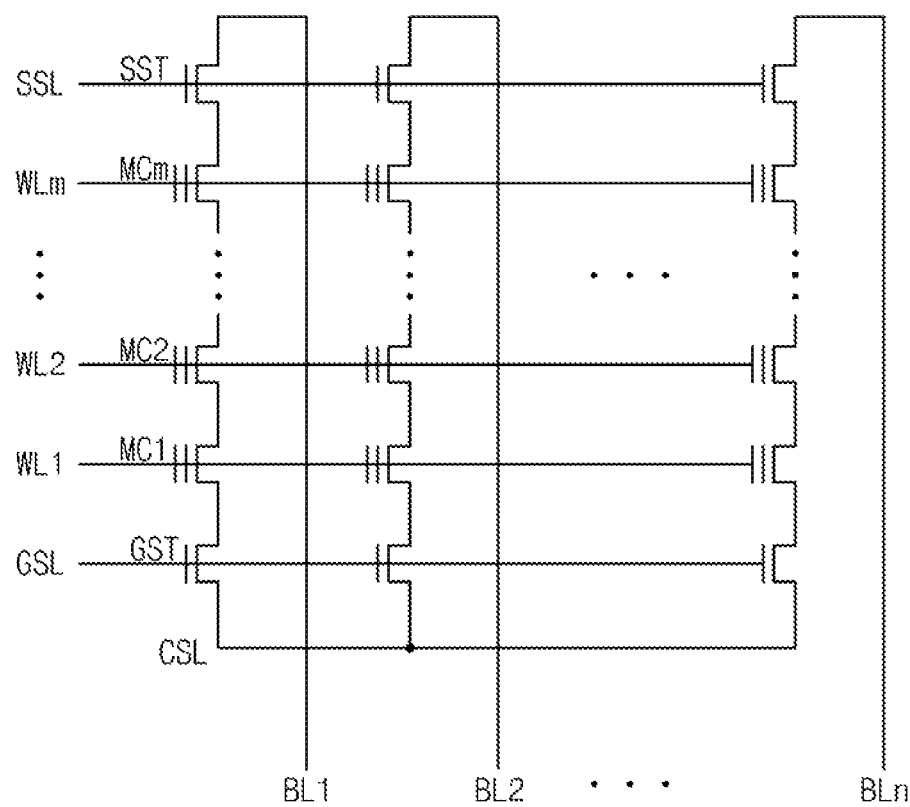
FIG. 3 is a circuit diagram schematically illustrating a memory cell array according to an exemplary embodiment of the inventive concept.

FIG. 3 is a circuit diagram schematically illustrating a memory cell array according to an exemplary embodiment of the inventive concept. Referring to FIG. 3, memory cells MC1, MC2, ... MCm arranged along a row direction may be connected with respective word lines WL1, WL2, ... WLm, that is, memory cells belonging to the same row may be connected with the same word line.

Memory cells MC1, MC2, ... MCm arranged along a column direction may be connected with bit lines BL1, BL2, ... BLn, that is, memory cells belonging to the same column may be connected with the same bit line.

String selection transistors SST may be connected between a bit line of the bit lines BL1, BL2, ... BLn and its memory cells MC1, MC2, ... MCm. The string selection transistors SST may be connected to a string selection line SSL. Ground selection transistors GST may be connected between the memory cells MC1, MC2, ... MCm and a common source line CSL. The ground selection transistors GST may be connected to a ground selection line GSL.

The memory cell array 1110a may be a planar NAND flash memory array.

Figure 4:
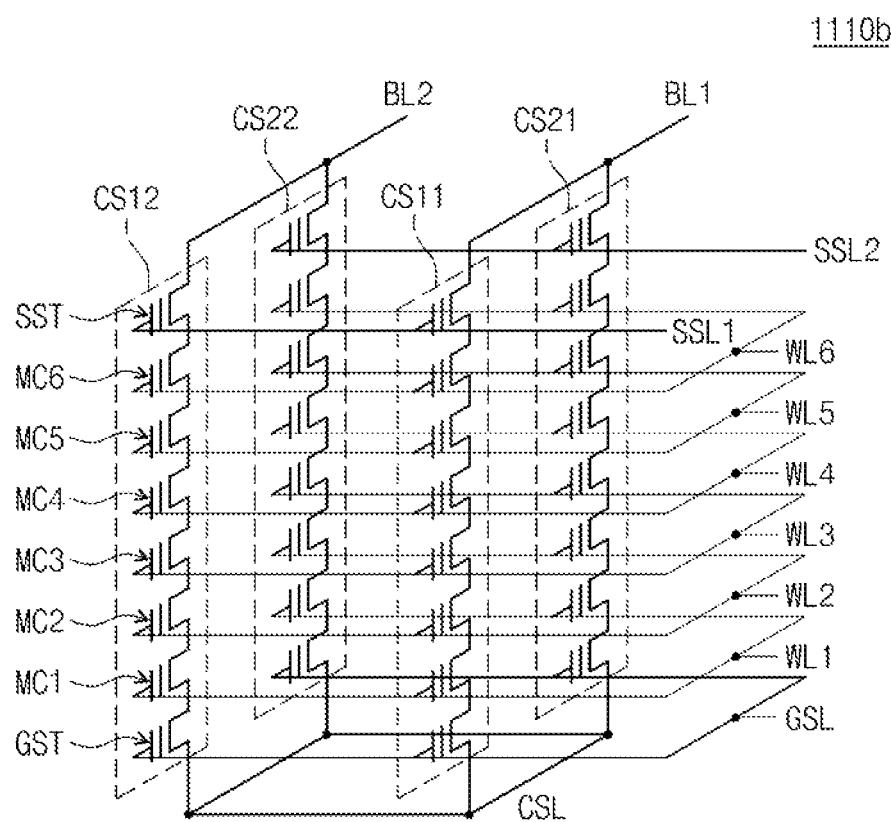
FIG. 4 is a perspective circuit diagram schematically illustrating a memory cell array according to an exemplary embodiment of the inventive concept.

FIG. 4 is a perspective circuit diagram schematically illustrating a memory cell array according to an exemplary embodiment of the inventive concept. Referring to FIG. 4, cell strings CS11, CS12, CS21, CS22 may be provided between bit lines BL1, BL2 and a common source line CSL. Cell string CS11 and cell string CS21 may be connected between the first bit line BL1 and the common source line CSL. Cell strings CS12, CS22 may be connected between the second bit line BL2 and the common source line CSL.

Memory cells placed at the same height may be connected in common with a word line (or, a dummy word line). Thus, when a voltage is applied to a word line (or, a dummy word line) placed at a specific height, it may be applied to all cell strings CS11, CS12, CS21, CS22 at the specific height.

Cell strings at different rows may be connected with different string selection lines SSL1, SSL2, respectively. Cell strings CS11, CS12, CS21, CS22 may be selected and unselected by row by selecting and unselecting the first and second string selection lines SSL1, SSL2. For example, cell strings CS11, CS12 or CS21, CS22 connected with an unselected string selection lien SSL1 or SSL2 may be electrically separated from the bit lines BL1, BL2. Cell strings CS21, CS22 or CS11, CS12 connected with a selected string selection line SSL2 or SSL1 may be electrically connected with the bit lines BL1, BL2.

The cell strings CS11, CS12, CS21, CS22 may be connected with the bit lines BL1, BL2 by column. The cell strings CS11, CS21 may be connected with the bit line BL1, and the cell strings CS12, CS22 may be connected with the bit line BL2. The cell strings CS11, CS12, CS21, CS22 may be selected and unselected by column by selecting and unselecting the bit lines BL1, BL2.

The memory cell array 1110b may be a vertical NAND flash memory array.

Figure 5:
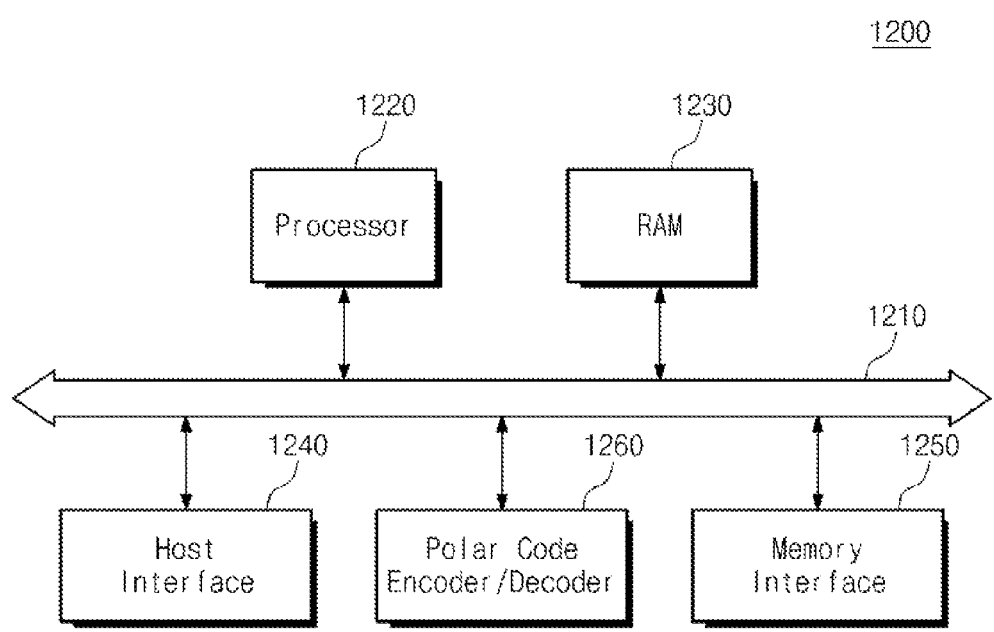
FIG. 5 is a block diagram schematically illustrating a controller according to an exemplary embodiment of the inventive concept.

FIG. 5 is a block diagram schematically illustrating a controller according to an exemplary embodiment of the inventive concept. Referring to FIG. 5, a controller 1200 may include a system bus 1210, a processor 1220, a RAM 1230, a host interface 1240, a memory interface 1250, and a polar code encoder/decoder 1260. The system bus 1210 may provide a channel among the constituent elements 1220 to 1260.

The processor 1220 may control the overall operation of the controller 1200.

The RAM 1230 may be used as one of a working memory of the processor 1220, a cache memory, and a buffer memory.

The host interface 1240 may communicate with the nonvolatile memory device 1100 according to a specific communication standard. In exemplary embodiments, the controller 1200 may communicate with an external device (e.g., a host 1400) via at least one of various communication standards such as Universal Serial Bus (USB), multimedia card (MMC), peripheral component interconnection (PCI), PCI-express (PCI-E), Advanced Technology Attachment (ATA), Serial-ATA, Parallel-ATA, small computer small interface (SCSI), enhanced small disk interface (ESDI), Integrated Drive Electronics (IDE), Firewire, and the like.

The memory interface 1250 may interface with the nonvolatile memory device 1100. For example, the memory interface 1250 may include a NAND interface or a NOR interface.

The polar code encoder/decoder 1260 may perform polar code encoding on data input from the external host 1400 shown in FIG. 1 and polar code decoding on data input from the nonvolatile memory device 1100.

When the nonvolatile memory device 1100 includes multi-bit cells storing multi-bit data (e.g., two or more bits of data), the polar code encoder/decoder 1260 may be configured to map bits of a polar coded code word onto multi-bit data (e.g., least significant bits, central significant bits, and most significant bits). Code word bits mapped onto the most significant bits may be written at the nonvolatile memory device 1100 as most significant bits. Code word bits mapped onto the central significant bits may be written at the nonvolatile memory device 1100 as central significant bits. Code word bits mapped onto the least significant bits may be written at the nonvolatile memory device 1100 as least significant bits.

The polar code encoder/decoder 1260 may be configured to restore a code word through remapping of least, central, and most significant bits read from the nonvolatile memory device 1100.

FIG. 6 is a table illustrating an example wherein a code word is mapped onto multi-bit data through a polar code encoder/decoder. Referring to FIGS. 5 and 6, when one memory cell stores 2-bit data and a code word has a length of two bits, the code word may be mapped onto multi-bit data according to one of two patterns. For example, a first bit of the code word may be mapped onto a least significant bit, and a second bit thereof may be mapped onto a most significant bit. On the other hand, a first bit of the code word can be mapped onto a most significant bit, and a second bit thereof can be mapped onto a least significant bit.

When one memory cell stores 2-bit data and a code word has a length of four bits, the code word may be mapped onto multi-bit data according to one of six patterns. For example, a first bit of the code word may be mapped onto a most significant bit, a second bit thereof may be mapped onto a most significant bit, a third bit of the code word may be mapped onto a least significant bit, and a fourth bit thereof may be mapped onto a least significant bit.

In other exemplary embodiments, a first bit of the code word may be mapped onto a most significant bit, a second bit thereof may be mapped onto a least significant bit, a third bit of the code word may be mapped onto a most significant bit, and a fourth bit thereof may be mapped onto a least significant bit.

In still other exemplary embodiments, a first bit of the code word may be mapped onto a most significant bit, a second bit thereof may be mapped onto a least significant bit, a third bit of the code word may be mapped onto a least significant bit, and a fourth bit thereof may be mapped onto a most significant bit.

In still other exemplary embodiments, a first bit of the code word may be mapped onto a least significant bit, a second bit thereof may be mapped onto a most significant bit, a third bit of the code word may be mapped onto a most significant bit, and a fourth bit thereof may be mapped onto a most significant bit.

In still other exemplary embodiments, a first bit of the code word may be mapped onto a least significant bit, a second bit thereof may be mapped onto a least significant bit, a third bit of the code word may be mapped onto a most significant bit, and a fourth bit thereof may be mapped onto a most significant bit.

In still other exemplary embodiments, a first bit of the code word may be mapped onto a least significant bit, a second bit thereof may be mapped onto a most significant bit, a third bit of the code word may be mapped onto a most significant bit, and a fourth bit thereof may be mapped onto a least significant bit.

When one memory cell stores 2-bit data and a code word has an n-bit length, the code word may be mapped onto multi-bit data according to one of patterns calculated using the following Equation 1.

$$n!/\left(\left(\frac{n}{2}\right)!\right)^2 \qquad \text{[Equation 1]}$$

When one memory cell stores m-bit data and a code word has an n-bit length, the code word may be mapped onto multi-bit data according to one of patterns calculated using the following Equation 2.

$$n!/\left(\left(\frac{n}{m}\right)!\right)^m \qquad \text{[Equation 2]}$$

The longer the length of a code word or the more the number of data bits stored at a memory cell, the more the number of patterns mapped onto a code word.

If a pattern, having the lowest error rate, from among patterns is selected and mapping between code word bits and multi-bit data is made according to the selected pattern, the reliability of a memory system 1000 may be improved. However, overhead may be generated to search a pattern having the lowest error rate. That is, calculation of error rates of patterns according to the Equation 2 and comparison of calculated results must be made to search a pattern having the lowest error rate.

To prevent the above-described problem, a polar code encoder/decoder 1260 according to an exemplary embodiment of the inventive concept may iteratively generate a pattern having a length shorter than the length of a code word and map code word bits onto multi-bit data according to the iterated pattern.

FIG. 7 is a flowchart illustrating an operating method of a controller according to an exemplary embodiment of the inventive concept. In exemplary embodiments, the operating method depicted in FIG. 7 may be performed by the polar code encoder/decoder 1260 of the controller 1200. Referring to FIGS. 5 and 7, in operation S110, the controller 1200 may generate an input word by adding frozen bits to information bits received from an external device, and may generate a polar coded code word by calculating a generation matrix on the input word.

In operation S120, the controller 1200 may read a mapping pattern. The controller 1200 may read a mapping pattern stored within the controller 1200.

In operation S130, the controller 1200 may iterate the mapping pattern. The controller 1200 may generate an iterated pattern through iteration of the read pattern. The length of the iterated pattern may be equal to the length of the polar coded code word.

In operation 5140, the controller 1200 may map a code word onto multi-bit data according to the iterated mapping pattern. When 2-bit data is stored at each memory cell of the nonvolatile memory device 1100, the controller 1200 may map each bit of the code word onto least significant bit (LSB) and most significant bit (MSB) according to the iterated mapping pattern.

When 3-bit data is stored at each memory cell of the nonvolatile memory device 1100, the controller 1200 may map each bit of the code word onto LSB, central significant bit (CSB), and MSB according to the iterated mapping pattern.

When m-bit data is stored at each memory cell of the nonvolatile memory device 1100, the controller 1200 may map each bit of the code word onto one of m multi-bit data according to the iterated mapping pattern.

In exemplary embodiments, encoding and mapping may be performed by the polar code encoder/decoder 1260 in FIG. 5. In other exemplary embodiments, encoding may be performed by the polar code encoder/decoder 1260 in FIG. 5, and mapping may be performed by a separate function block provided within the controller 1200.

Figure 8:
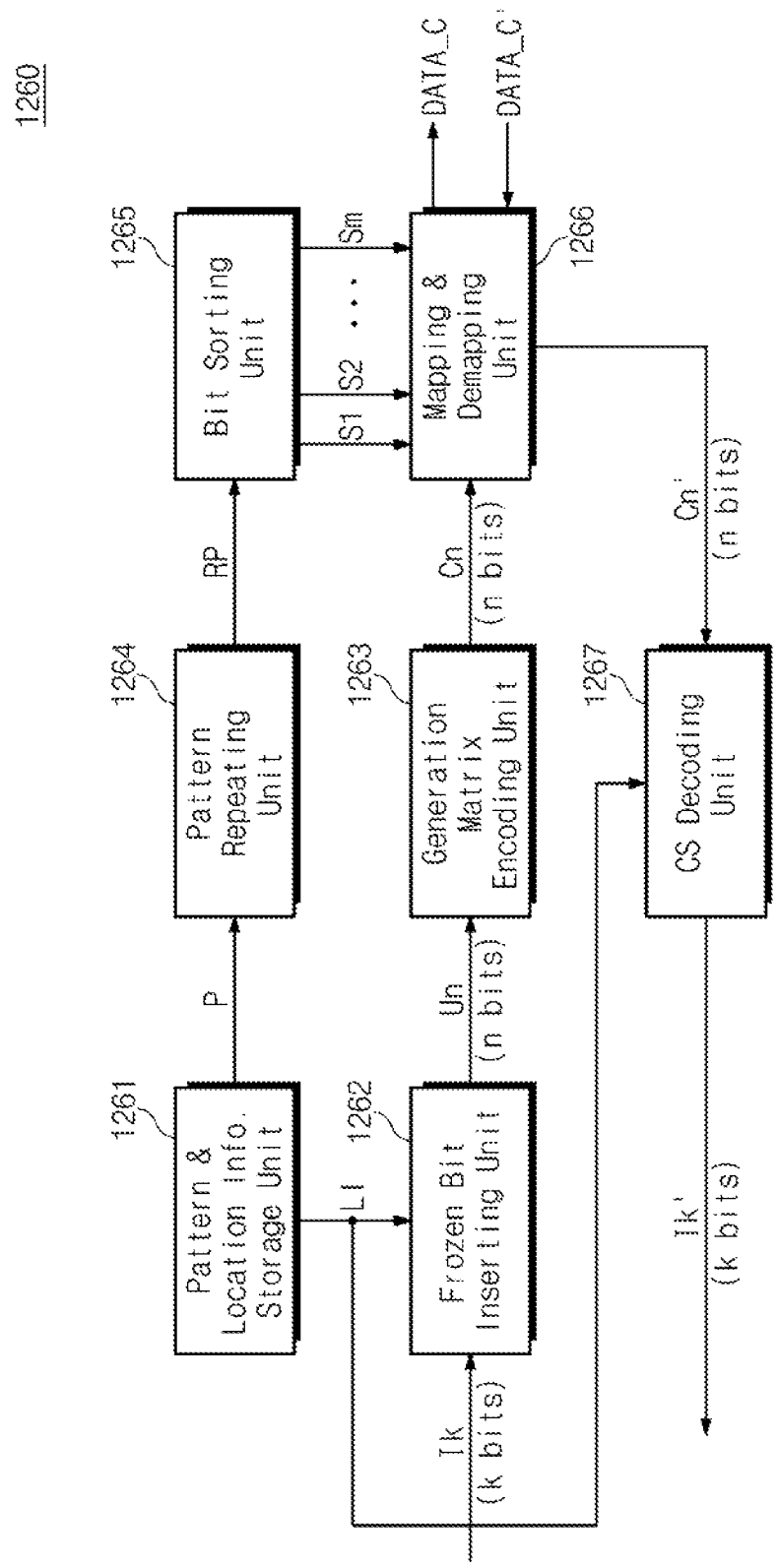
FIG. 8 is a block diagram schematically illustrating a polar code encoder/decoder according to an exemplary embodiment of the inventive concept.

FIG. 8 is a block diagram schematically illustrating a polar code encoder/decoder according to an exemplary embodiment of the inventive concept. Referring to FIGS. 5 and 8, the polar code encoder/decoder 1260 may include a pattern and location information storage unit 1261, a frozen bit inserting unit 1262, a generation matrix encoding unit 1263, a pattern repeating unit 1264, a bit sorting unit 1265, a mapping and demapping unit 1266, and a successive cancellation decoding unit 1267.

The pattern and location information storage unit 1261 may be configured to store a pattern P and location information LI. The pattern P may be data for mapping between a code word Cn and multi-bit data. The length of the pattern P stored at the pattern and location information storage unit 1261 may be shorter than the length of the code word Cn. The length of the pattern P stored at the pattern and location information storage unit 1261 may be one of factors of the length of the code word Cn or a product of at least two or more factors thereof.

The location information LI may indicate information associated with a location where a frozen bit is inserted.

The frozen bit inserting unit 1262 may receive information bits W. For example, the information bits Ik may be received from an external host 1400 through a host interface 1240. The length of the information bits may be k. The frozen bit inserting unit 1262 may receive the location information LI from the pattern and location information storage unit 1261. The frozen bit inserting unit 1262 may insert frozen bits into a location of the information bits Ik pointed to by the location information LI. The frozen bit inserting unit 1262 may generate an input word Un by inserting frozen bits into the information bits Ik.

The generation matrix encoding unit 1263 may receive the input word Un from the frozen bit inserting unit 1262. The generation matrix encoding unit 1263 may calculate the input word Un and a generation matrix. The generation matrix encoding unit 1263 may output an encoding result as the code word Cn. The length of the code word Cn may be n.

The pattern repeating unit 1264 may receive a pattern P from the pattern and location information storage unit 1261. The pattern repeating unit 1264 may repeat the input pattern P to generate a repeated pattern RP. The pattern repeating unit 1264 may repeat the pattern P such that the length of the repeated pattern RP becomes equal to the length of the code word Cn.

The bit sorting unit 1265 may receive the repeated pattern RP from the pattern repeating unit 1264. The bit sorting unit 1265 may generate bit set data S1, S2, ... Sm based upon the repeated pattern RP. The bit set data Si may indicate code word bits to be mapped onto a first bit (e.g., LSB) of multi-bit data. The bit set data S2 may indicate code word bits to be mapped onto a second bit (e.g., CSB) of multi-bit data. The bit set data Sm may indicate code word bits to be mapped onto an mth bit (e.g., MSB) of multi-bit data. In exemplary embodiments, the bit set data S1, S2, ... Sm may indicate locations of code word bits.

The mapping and demapping unit 1266 may receive the code word Cn from the generation matrix encoding unit 1263 and the bit set data S1, S2, . . . Sm from the bit sorting unit 1265. The mapping and demapping unit 1266 may map code word bits corresponding to the bit set data S1 onto LSB data. The mapping and demapping unit 1266 may map code word bits corresponding to the bit set data S2 onto CSB data. The mapping and demapping unit 1266 may map code word bits corresponding to the bit set data Sm onto MSB data. A mapping result may be output as coded data DATA_C. For example, the coded data DATA_C may be transferred to a nonvolatile memory device 1100 through a memory interface 1250.

The mapping and demapping unit 1266 may receive coded data DATA_C'. For example, coded data DATA_C written to the nonvolatile memory device 1100 may be read out, and the read data DATA_C' may be provided to the mapping and demapping unit 1266 through the memory interface 1250.

The read data DATA_C' may be multi-bit data. The read data DATA_C' may include LSB data, CSB data, and MSB data. The mapping and demapping unit 1266 may restore a read code word Cn', based upon the bit set data S1, S2, . . . Sm from the bit sorting unit 1265. The mapping and demapping unit 1266 may restore a read code word Cn' by sequentially arranging the read data DATA_C' bit by bit based upon mapping information included in the bit set data S1, S2, . . . Sm. The length of the read code word Cn' may be n.

The successive cancellation decoding unit 1267 may receive the location information LI from the pattern and location information storage unit 1261 and the read code word Cn' from the mapping and demapping unit 1266. The successive cancellation decoding unit 1267 may perform successive cancellation decoding based upon the location information LI and the read code word Cn'. The successive cancellation decoding result may be output as read information bits Ik'. For example, the read information bits Ik' may be output to the external host 1400 via a host interface 1240. The length of the read information bits Ik' may be k.

In other exemplary embodiments, the bit sorting unit 1265 and a mapping part of the mapping and demapping unit 1266 may form a multiplexer. The multiplexer may receive the repeated pattern RP as a selection signal output of the pattern repeating unit 1264. The multiplexer may receive the code word Cn as an input signal output from the generation matrix encoding unit 1263.

The multiplexer may output each bit of the code word Cn as an MSB, CSB, or LSB bit according to whether the repeated pattern RP being the selection signal indicates MSB, CSB, or LSB.

In exemplary embodiments, there may be described an example that successive cancellation decoding is performed. However, the inventive concept is not limited thereto. For example, the inventive concept may be applied to various methods (e.g., belief propagation, a message passing algorithm for performing inference on graphical models) capable of decoding a polar coded code word.

Figures 9, 10:
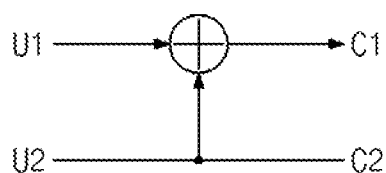
FIG. 9 is a table illustrating an encoding operation of a polar code encoder/decoder.
FIG. 10 is a diagram schematically illustrating a generation matrix encoding unit according to an exemplary embodiment of the inventive concept.

FIG. 9 is a table illustrating an encoding operation of a polar code encoder/decoder. Referring to FIGS. 8 and 9, the generation matrix encoding unit 1263 may generate a code word Cn of '100110011011'. The pattern and location information storage unit 1261 may output a pattern P of LSB—CSB-MSB-CSB-MSB-LSB.

The pattern repeating unit 1264 may receive the pattern P, and may repeat the pattern P such that a repeated pattern RP having the same length as a code word Cn is generated. In exemplary embodiments, if the length of the code word Cn is 12 and the length of the pattern P is 6, the repeated pattern RP may be generated by repeating the pattern P twice. The repeated pattern RP may be LSB-CSB-MSB-CSB-MSB-LSB-LSB-CSB-MSB-CSB-MSB-LSB.

The bit sorting unit 1265 may generate bit set data S1, S2, Sm based upon the repeated pattern RP. In exemplary embodiments, bit set data S1 may indicate code word bits mapped onto LSB. In the repeated pattern RP; since $1^{st}$, $6^{th}$, $7^{th}$, and $10^{th}$ bits may indicate LSB, the bit set data S1 may indicate '1', '6', '7', and '12' being locations of code word bits mapped onto LSB.

Bit set data S2 may indicate code word bits mapped onto CSB. In the repeated pattern RP, since $2^{nd}$, $4^{th}$, $8^{th}$, and $11^{th}$ bits may indicate CSB, the bit set data S2 may indicate '2', '4', '8', and '10' being locations of code word bits mapped onto CSB.

Bit set data S3 may indicate code word bits mapped onto MSB. In the repeated pattern RP, since $3^{rd}$, $5^{th}$, $9^{th}$, and $12^{th}$ bits may indicate MSB, the bit set data S3 may indicate '3', '5', '9', and '11' being locations of code word bits mapped onto MSB.

The mapping and demapping unit 1266 may map the code word Cn onto multi-bit data based upon the bit set data S1 and S2. Since the bit set data S1 indicating LSB data is '1', '6', '7', and '12' of the code word Cn, '1001' being $1^{st}$, $6^{th}$, $7^{th}$, and $12^{th}$ bits may be mapped onto LSB. Since the bit set data S2 indicating CSB data is '2', '4', '8', and '10' of the code word Cn, '0110' being $2^{nd}$, $4^{th}$, $8^{th}$, and $10^{th}$ bits may be mapped onto CSB. Since the bit set data S3 indicating MSB data is '3', '5', '9', and '11' of the code word Cn, '0111' being $3^{rd}$, $5^{th}$, $9^{th}$, and $11^{th}$ bits may be mapped onto MSB.

As described above, the controller 1200 may generate a repeated pattern RP through iteration of a previously stored pattern P, and may map a code word Cn onto multi-bit data based upon the repeated pattern RP. Since a device for storing a pattern P becomes small-sized or a device for calculating a pattern P is not required, the complexity of the controller 1200 using polar coding may be reduced. Also, the reliability of the controller 1200 may be improved through the polar coding.

FIG. 10 is a diagram schematically illustrating a generation matrix encoding unit according to an exemplary embodiment of the inventive concept. In exemplary embodiments, the length of an input word Un provided to the generation matrix encoding unit 1263a may be 2, and the length of a code word Cn generated by the generation matrix encoding unit 1263a may be 2.

Referring to FIG. 10, the generation matrix encoding unit 1263a may output a sum of two input bits as a first output bit and a second input bit as a second output bit.

Figure 11:
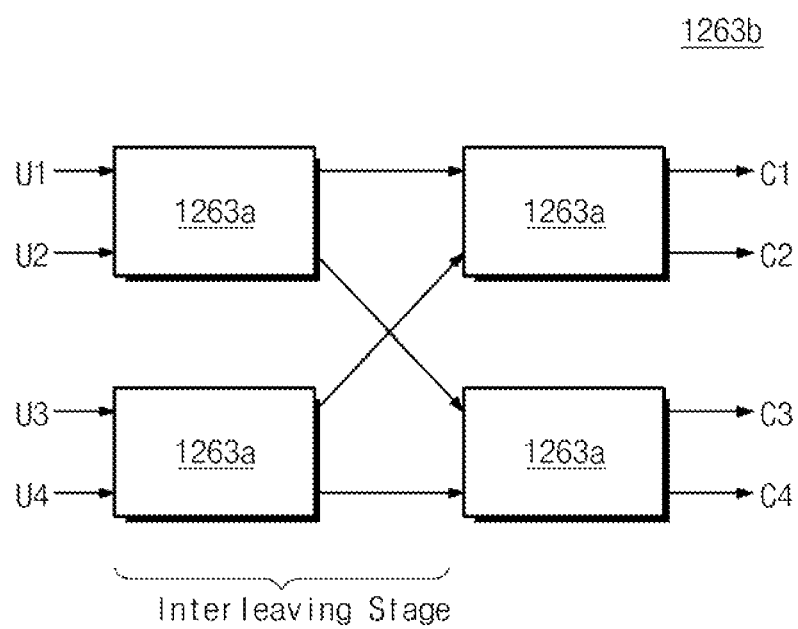
FIG. 11 is a diagram schematically illustrating a generation matrix encoding unit according to an exemplary embodiment of the inventive concept.

FIG. 11 is a diagram schematically illustrating a generation matrix encoding unit according to an exemplary embodiment of the inventive concept. In exemplary embodiments, the length of an input word Un provided to a generation matrix encoding unit 1263b may be 4, and the length of a code word Cn generated by the generation matrix encoding unit 1263b may be 4.

Referring to FIG. 11, the generation matrix encoding unit 1263b may include a 2-length generation matrix encoding unit 1263a which is described with reference to FIG. 10. The 2-length generation matrix encoding units 1263a may be disposed according to the length of a code word Cn. The 2-length generation matrix encoding units 1263a may be provided at a front stage as an interleaving stage.

Figure 12:
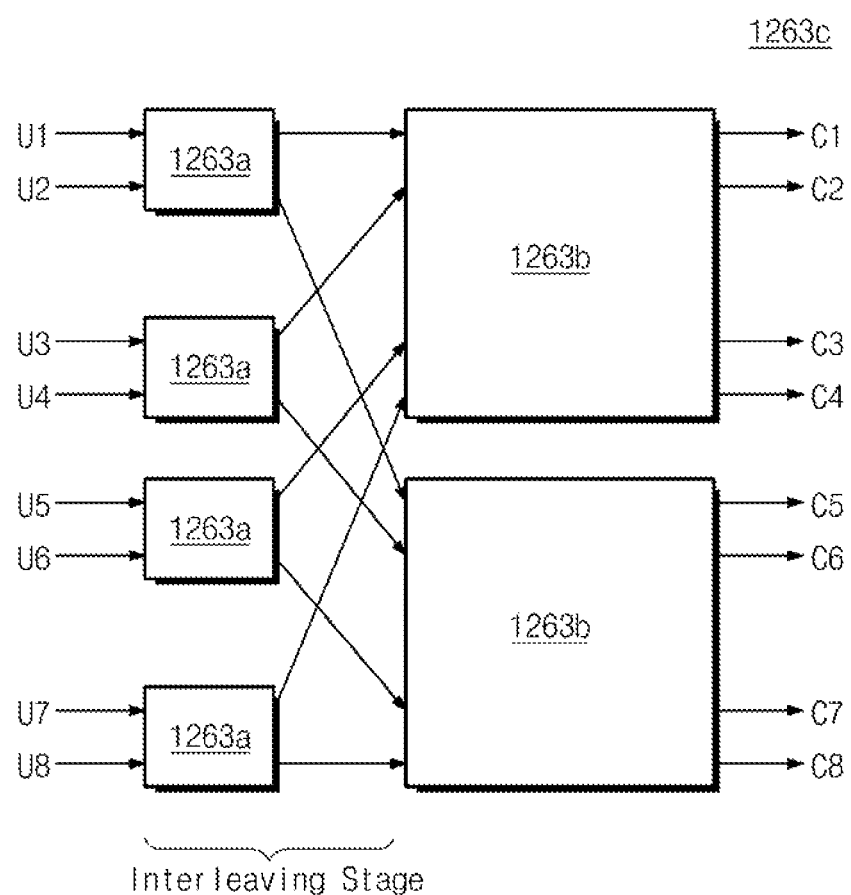
FIG. 12 is a diagram schematically illustrating a generation matrix encoding unit according to an exemplary embodiment of the inventive concept.

FIG. 12 is a diagram schematically illustrating a generation matrix encoding unit according to an exemplary embodiment of the inventive concept. In exemplary embodiments, the length of an input word Un provided to a generation matrix encoding unit 1263c may be 8, and the length of a code word Cn generated by the generation matrix encoding unit 1263c may be 8.

Referring to FIG. 12, the generation matrix encoding unit 1263c may include a 2-length generation matrix encoding unit 1263a, which is described with reference to FIG. 10, and a 4-length generation matrix encoding unit 1263b which is described with reference to FIG. 11. The 4-length generation matrix encoding units 1263c may be disposed according to the length of a code word Cn. The 2-length generation matrix encoding units 1263a may be provided at a front stage as an interleaving stage.

As described with reference to FIGS. 10 to 12, a generation matrix encoding unit 1263 for converting an n-length input word Un into an n-length code word Cn may include two n/2-length generation matrix encoding units and an interleaving stage disposed at front stage thereof.

In FIGS. 10 to 12, there may be described a generation matrix encoding unit 1263 outputting a code word Cn having a length of $2^n$. However, the inventive concept is not limited thereto. For example, the generation matrix encoding unit 1263 may be configured to output a code word Cn having a length corresponding to a square of at least one prime number or to a product of squares of at least two or more prime numbers.

Figure 13:
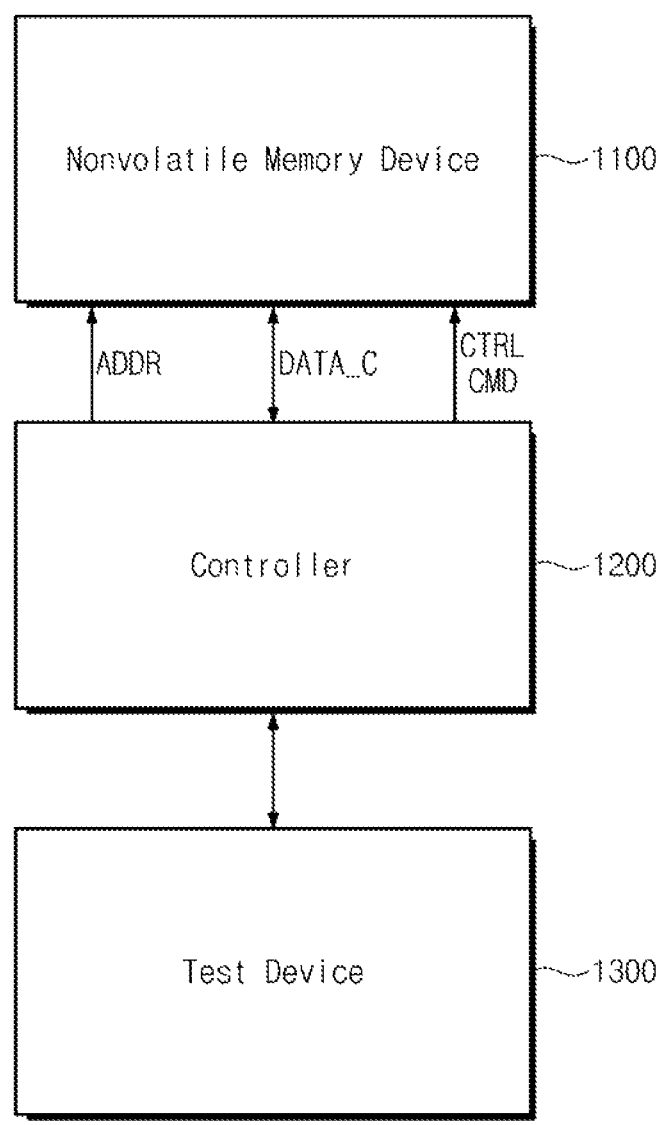
FIG. 13 is a block diagram schematically illustrating a test device 1300 connected with a nonvolatile memory device and a controller in FIG. 1.

FIG. 13 is a block diagram schematically illustrating a test device 1300 connected to a nonvolatile memory device and a controller in FIG. 1. Referring to FIG. 13, a test device 1300 may be configured to store a pattern P at the controller 1200. The test device 1300 may select a pattern P based upon information about a nonvolatile memory device 1100 and the controller 1200. The test device 1300 may store the selected pattern P at the controller 1200.

Figure 14:
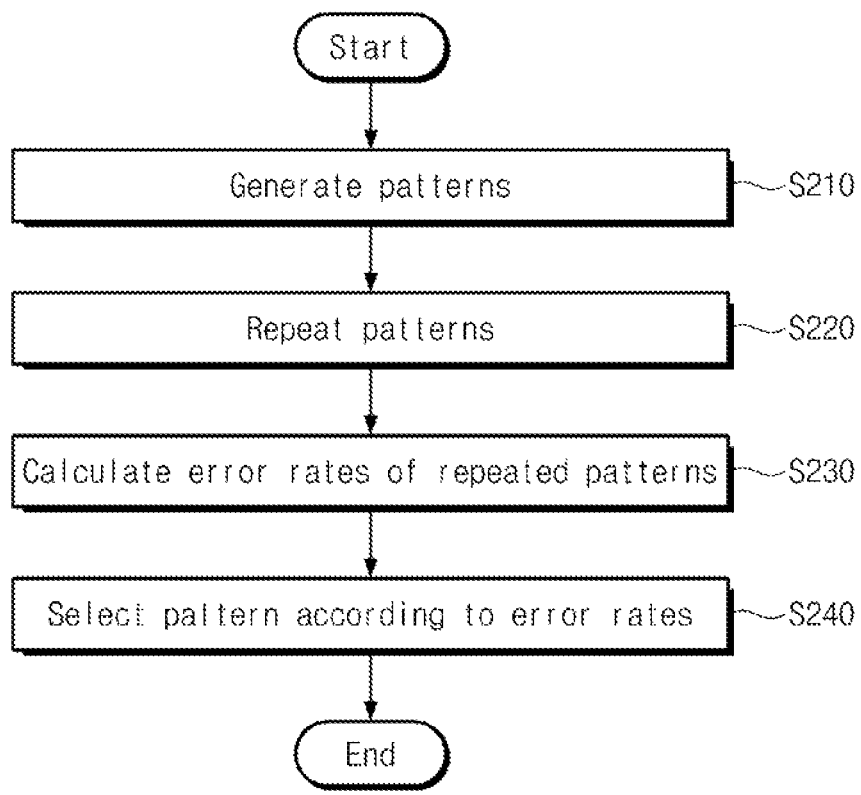
FIG. 14 is a flowchart illustrating a mapping pattern selecting method according to an exemplary embodiment of the inventive concept.

FIG. 14 is a flowchart illustrating a mapping pattern selecting method according to an exemplary embodiment of the inventive concept. Referring to FIGS. 13 and 14, in operation 5210, the test device 1300 may generate patterns. In operation S220, the test device 1300 may generate repeated patterns by repeating the patterns. In operation 5230, the test device 1300 may calculate error rates of the repeated patterns. In exemplary embodiments, error rates of the repeated patterns may be calculated depending upon a probability density function of LSB (or, an approximated probability density function), a probability density function of CSB (or, an approximated probability density function), and a probability density function of MSB (or, an approximated probability density function). In operation 5240, the test device 1300 may select a pattern according to the calculated error rates. The selected pattern may be stored at the controller 1200.

Figure 15:
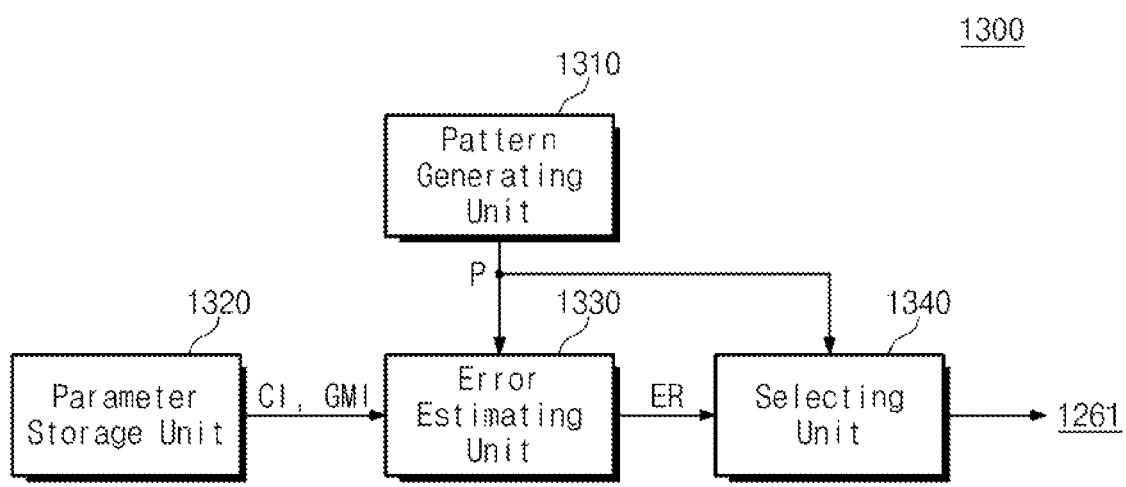
FIG. 15 is a block diagram schematically illustrating a test device in FIG. 13.

FIG. 15 is a block diagram schematically illustrating a test device in FIG. 13. Referring to FIGS. 13 and 15, the test device 1300 may include a pattern generating unit 1310, a parameter storage unit 1320, an error estimating unit 1330, and a selecting unit 1340.

The pattern generating unit 1310 may be configured to generate a plurality of patterns P. In exemplary embodiments, as described with reference to FIGS. 1 to 12, a length shorter than the length of a code word Cn may be selected. The pattern generating unit 1310 may generate patterns P having the selected length. In exemplary embodiments, the pattern generating unit 1310 may generate patterns P the number of which is described with reference to FIG. 6.

The parameter storage unit 1320 may be configured to provide information about a nonvolatile memory device 1100 and a controller 1200. The parameter storage unit 1320 may be configured to store channel information CI of the nonvolatile memory device 1100. In exemplary embodiments, information about probability density functions (or, approximated probability density functions) of memory cells may be stored. A code word Cn may be programmed at memory cells of the nonvolatile memory device 1100 and read out therefrom. The code word Cn may be source data, and data read out from the nonvolatile memory device 1100 may be data received through channels formed by a plurality of memory cells. The parameter storage unit 1320 may store information associated with probability density functions corresponding to channels of the nonvolatile memory device 1100, that is, channels where multi-bit data is stored (hereinafter, channels of memory cells are referred to as first channels).

The parameter storage unit 1320 may be configured to store generation matrix information GMI of a generation matrix encoding unit 1263 of the controller 1200. For example, the parameter storage unit 1320 may store information indicating whether an input word Un is converted into a code word Cn through any calculation.

The error estimating unit 1330 may receive the patterns P from the pattern generating unit 1310 and the channel information CI and generation matrix information GMI from the parameter storage unit 1320. The error estimating unit 1330 may estimate error rates of channels, through which bits of the input word Un are transferred, based upon the channel information CI and generation matrix information GMI. Hereinafter, channels through which bits of the input word Un are transferred may be referred to as second channels. For example, there may be estimated a decoded bit error rate (BER), that is, error rates when polar decoding and polar encoding are performed with respect to an input word Un transferred via the second channels.

Bits of the input word Un may be converted into a code word Cn to be written at the nonvolatile memory device 1100. Successive cancellation decoding may be performed with respect to data read out from the nonvolatile memory device 1100 to restore a read input word Un'. At this time, bits of the input word Un may be comprehended to be transferred via the second channels. Information transmitted via the second channels, and received information may be a read input word Un'.

Bits of the code word Cn may be programmed at memory cells of the nonvolatile memory device 1100. Data read out from memory cells of the nonvolatile memory device 1100 may be a read code word Cn'. Each of the bits of the code word Cn may be transferred via second channels. Information transmitted via the second channels may be the code word Cn, and input information may be the read code word Cn'.

Error rates of first channels may include LSB error probability and MSB error probability. The error rates of the first channels may be acquired from characteristics of memory cells of the nonvolatile memory device 110. For example, the error rates of the first channels may be acquired by testing memory cells of the nonvolatile memory device 110 or from calculation based upon a program/erase cycle of memory cells. The acquired error rates may be the chance that an error is generated at bits of the code word Cn.

Whether a specific bit of the code word Cn is mapped onto LSB or MSB may be determined according to patterns P generated from a pattern generating unit 1310. LSB error probability may be different from MSB error probability. Thus, the error probability of a specific bit of the code word Cn, that is, the error rate that an error is generated at a specific channel of the second channels may be varied according to patterns P.

An input word Un may be converted into a code word Cn through calculation with a generation matrix. If the error probability of bits of the code word Cn is inversely converted by the generation matrix, a conversion result may indicate the error probabilities of bits of the input word Un (e.g., the error probabilities of the second channels).

Thus, the error probabilities of memory cells (or, first channels) (i.e., that is, generation matrix information GMI being conversion information of channel information CI and the generation matrix) is acquired, the error probability of each bit of the input word Un may be estimated.

The error estimating unit 1330 may select one of the patterns P to estimate the error probability of each bit of the input word Un using the selected pattern. The error estimating unit 1330 may estimate the error probability on each of the patterns P. The error estimating unit 1330 may transfer error estimation results ER to the selecting unit 1340.

In exemplary embodiments, the error estimating unit 1330 may generate a repeated pattern RP through iteration of the selected pattern, and may estimate the error probability using the repeated pattern RP.

The selecting unit 1340 may receive the error estimation results ER from the error estimating unit 1330 and the patterns P from the pattern generating unit 1310. The selecting unit 1340 may select one of the patterns P as a final pattern according to the error estimation results ER. For example, the selecting unit 1340 may select such a pattern that an average error rate of the second channels is lowest. If at least one of error rates of the second channels exceeds a reference value, the selecting unit 1340 may not select a corresponding pattern. A finally selected pattern may be stored at a pattern and location information storage unit 1261 of the controller 1200.

As described above, instead of an estimation and selection of an error rate of a mapping pattern corresponding to the length of the code word Cn, an error rate of a pattern having a length shorter than the length of a code word Cn may be estimated and selected. When polar encoding is performed, a repeated pattern RP corresponding to the length of the code word Un may be generated by repeating a selected pattern. The code word Cn may be mapped onto multi-bit data based upon the repeated pattern RP. Since a pattern having a shortened length, the complexity of the controller 1200 and the test device 1300 may be reduced.

Figure 16:
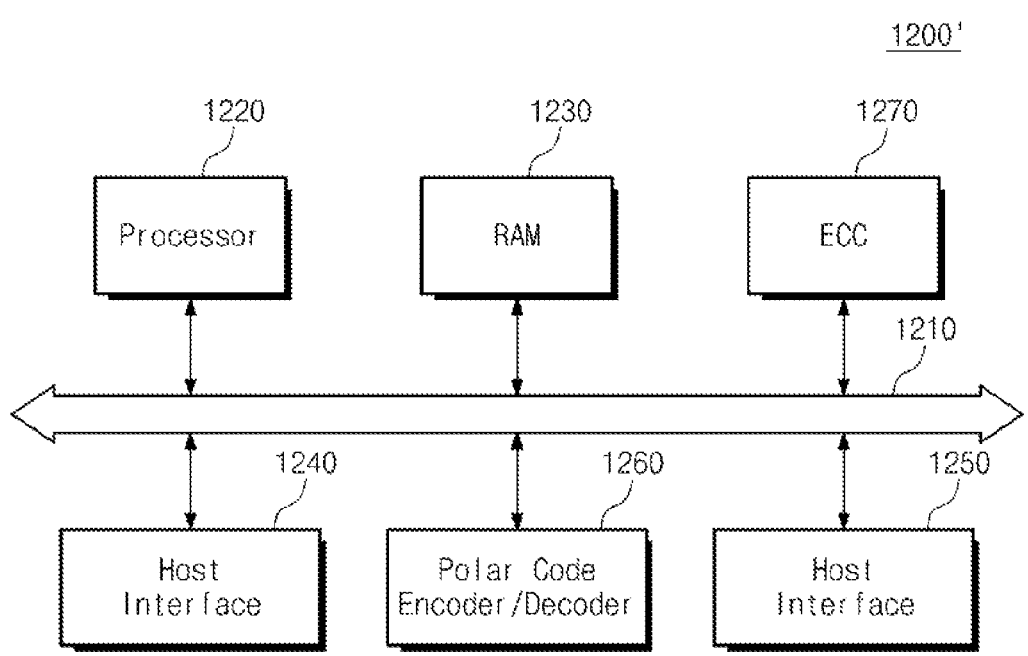
FIG. 16 is a block diagram schematically illustrating a controller according to an exemplary embodiment of the inventive concept.

FIG. 16 is a block diagram schematically illustrating a controller according to an exemplary embodiment of the inventive concept. Compared with a controller 1200 in FIG. 5, a controller 1200' in FIG. 16 may further include an error-correcting code (ECC) block 1270. The ECC block 1270 may perform encoding and decoding using an error correction code. The ECC block 1270 may perform encoding and decoding using a class of cyclic error-correcting codes that are constructed using finite fields (BCH codes), non-binary cyclic error-correcting Reed-Solomon codes (RS codes), high-performance forward error correction codes (turbo codes), linear error correcting low-density parity-check codes (LDPC codes), and the like.

Referring to FIGS. 1, 8, and 16, code word bits mapped onto LSB and MSB using a repeated pattern RP may be encoded through the ECC block 1270. The encoded data may be written to the nonvolatile memory device 1100 as LSB data and MSB data. LSB data and MSB data read out from the nonvolatile memory device 1100 may be decoded through the ECC block 1270. The polar code encoder/decoder 1260 may perform successive cancellation decoding on the decoded LSB and MSB data.

In other exemplary embodiments, an input word Un may be encoded through the ECC block 1270. The encoded data may be encoded through the polar code encoder/decoder 1260, and may be mapped onto LSB data and MSB data according to a repeated pattern RP. The mapped LSB data and MSB data may be written at the nonvolatile memory device 1100. The polar code encoder/decoder 1260 may perform successive cancellation decoding on LSB data and MSB data read out from the nonvolatile memory device 1100. The decoded data may be decoded through the ECC block 1270.

Figure 17:
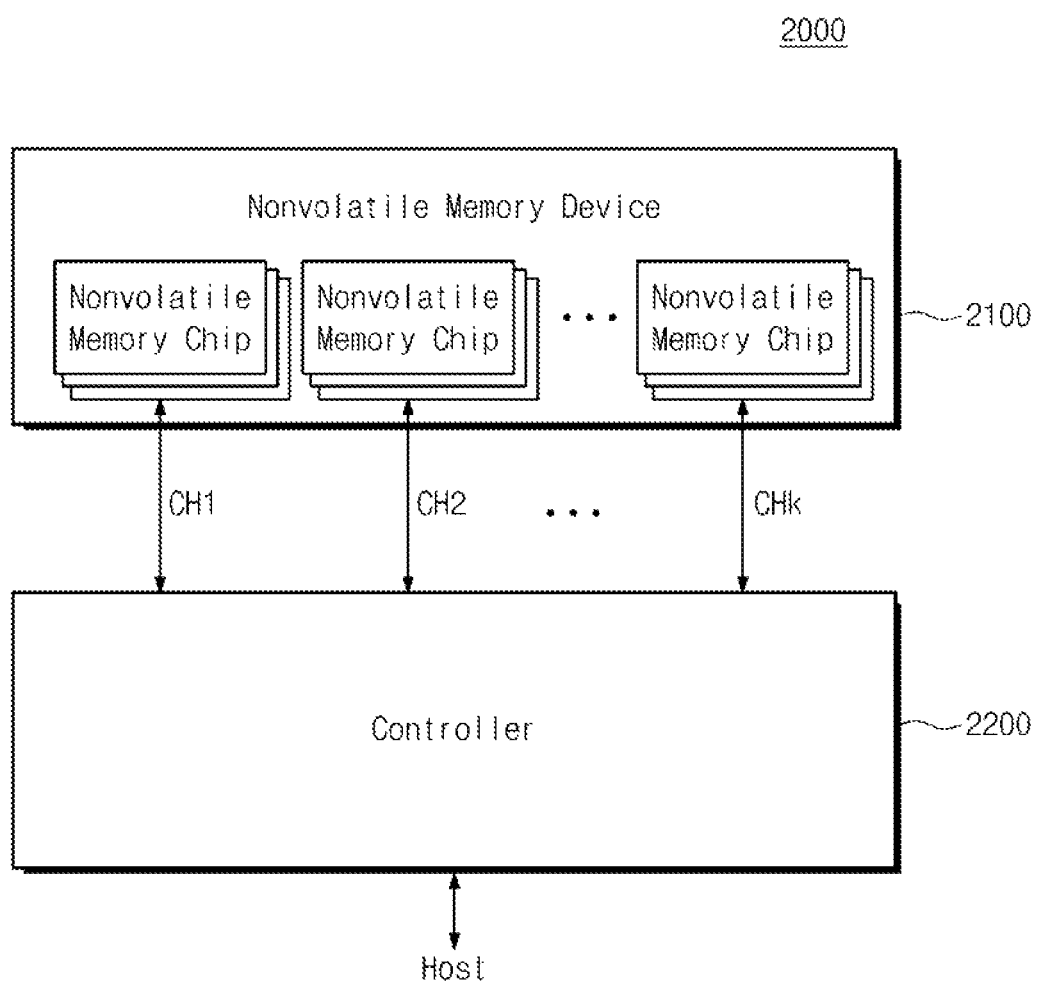
FIG. 17 is a block diagram illustrating an application of a memory system in FIG. 1.

FIG. 17 is a block diagram illustrating an application of a memory system in FIG. 1. Referring to FIG. 17, a memory system 2000 may include a nonvolatile memory device 2100 and a controller 2200. The nonvolatile memory device 2100 may include a plurality of nonvolatile memory chips, which form a plurality of groups. Nonvolatile memory chips in each group may be configured to communicate with the controller 2200 via one common channel. In an exemplary embodiment, the plurality of nonvolatile memory chips may communicate with the controller 2200 via a plurality of channels CH1 to CHk.

In FIG. 17, there is described the case that one channel is connected with a plurality of nonvolatile memory chips. However, the memory system 2000 can be modified such that one channel is connected with one nonvolatile memory chip.

Figure 18:
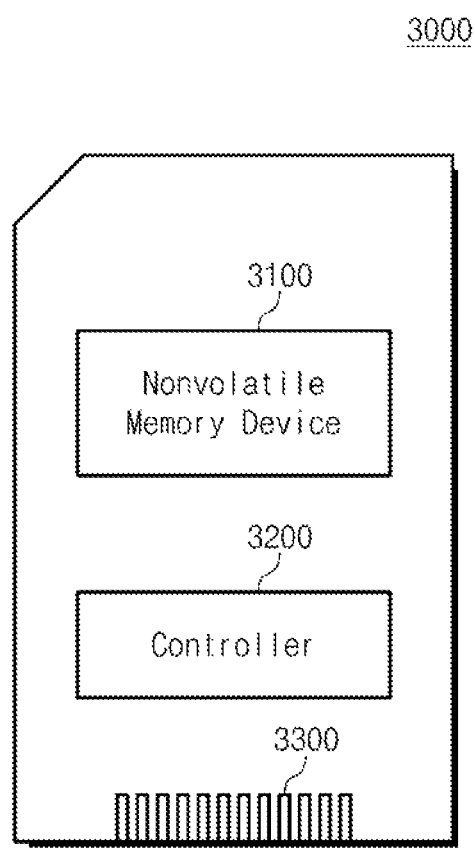
FIG. 18 is a diagram illustrating a memory card according to an exemplary embodiment of the inventive concept.

FIG. 18 is a diagram illustrating a memory card according to an exemplary embodiment of the inventive concept. Referring to FIG. 18, a memory card 3000 may include a nonvolatile memory device 3100, a controller 3200, and a connector 3300.

The connector 3300 may connect the memory card 3000 with the host 1400 electrically.

The memory card 3000 may be formed of memory cards such as a PC Personal Computer Memory Card International Association (PCMCIA) card, a compact flash (CF) card, a SmartMedia (SM) memory card, a memory stick, a multimedia card (MMC, RS-MMC, MMCmicro), a security card (SD, miniSD, microSD, SDHC), a universal flash storage (UFS) device, and the like.

Figure 19:
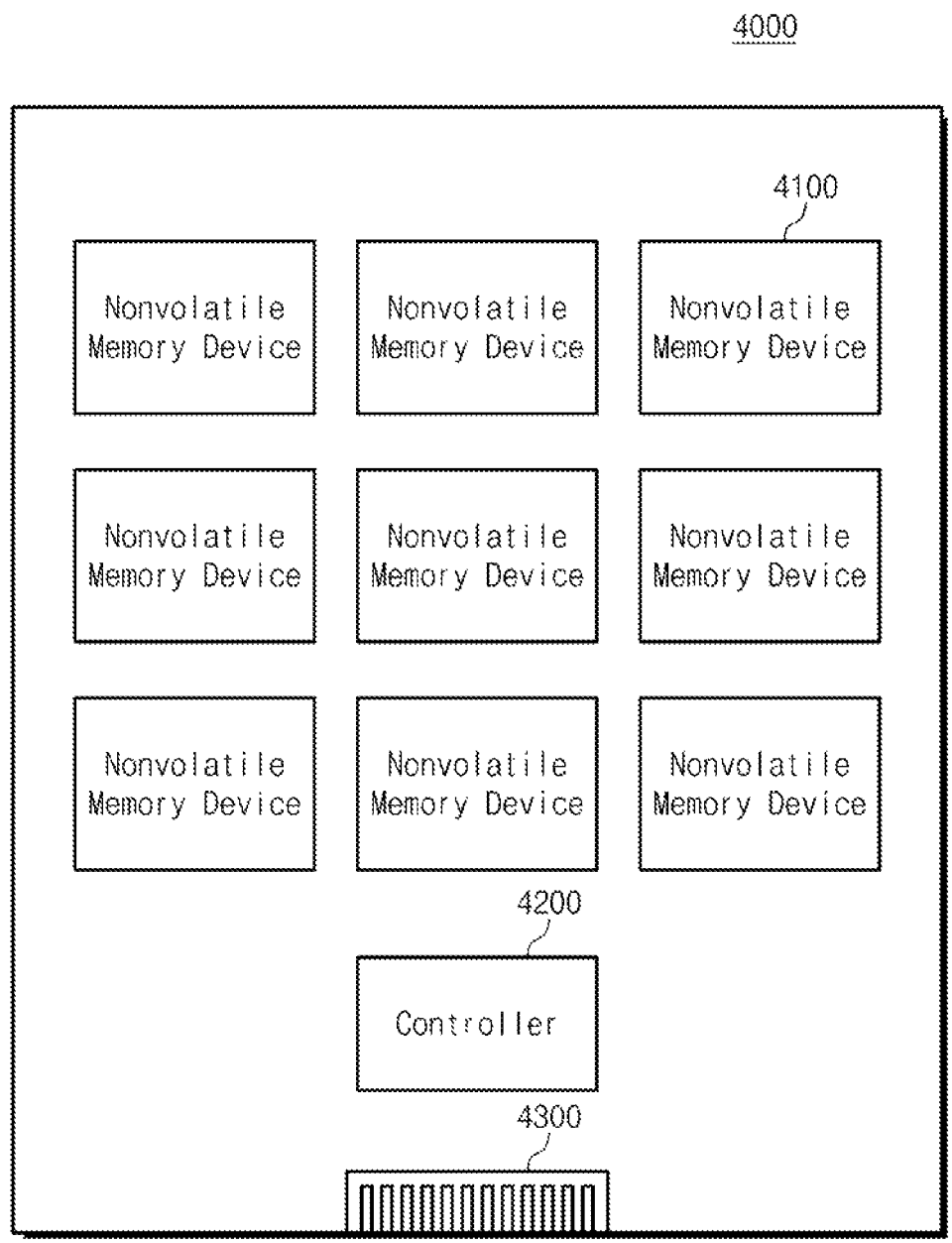
FIG. 19 is a diagram illustrating a solid state drive according to an exemplary embodiment of the inventive concept.

FIG. 19 is a diagram illustrating a solid state drive according to an exemplary embodiment of the inventive concept. Referring to FIG. 19, the solid state drive 4000 may include a plurality of nonvolatile memory devices 4100, a controller 4200, and a connector 4300.

The connector 4300 may connect the solid state driver 4000 with the host 1400 electrically.

Figure 20:
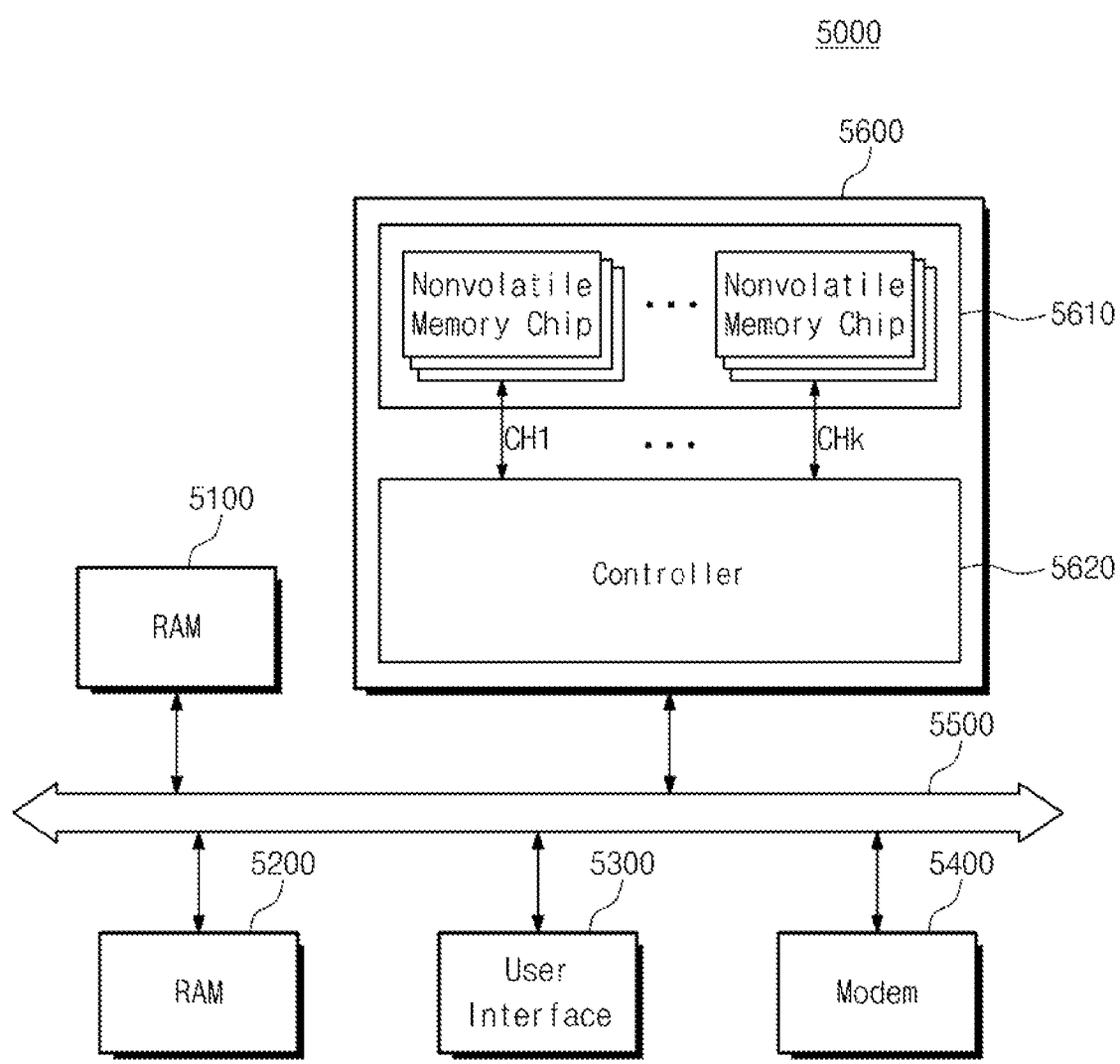
FIG. 20 is a block diagram illustrating a computing system according to an exemplary embodiment of the inventive concept.

FIG. 20 is a block diagram illustrating a computing system according to an exemplary embodiment of the inventive concept. Referring to FIG. 20, the computing system 5000 may include a central processing unit 5100, a RAM 5200, a user interface 5300, a modem 5400, a system bus 5500, and a memory system 5600.

The memory system 5600 may be connected electrically with the elements 5100, 5200, . . . 5400 via the system bus 5500. Data provided via the user interface 5300 or processed by the central processing unit 5100 may be stored in the memory system 5600.

The memory system 5600 may include a nonvolatile memory device 5610 and a controller 5620. The nonvolatile memory device 5610 may include a plurality of nonvolatile memory chips. The memory system 5600 may be a memory system 1000 or 2000 described with reference to FIG. 1 or 17.

In FIG. 20, there is illustrated the case that a nonvolatile memory device 5610 is connected to the system bus 5500 via a controller 5620. However, the nonvolatile memory device 56100 can be electrically connected directly to the system bus 5500.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An operating method of a memory controller configured to control a nonvolatile memory device, the operating method comprising:
   generating by the memory controller a code word through polar encoding of information bits from an external device;
   reading by the memory controller a mapping pattern stored within the memory controller;
   generating by the memory controller a repeated mapping pattern through iteration of the mapping pattern; and
   mapping by the memory controller each bit of the code word onto a specific bit of multi-bit data of multi-bit cells of the nonvolatile memory device, based upon the repeated mapping pattern.

2. The operating method of claim 1, wherein a length of the repeated mapping pattern is equal to a length of the code word.

3. The operating method of claim 1, wherein mapping each bit of the code word onto a specific bit of multi-bit data of the nonvolatile memory device comprises mapping each bit of the code word onto a least significant bit or a most significant bit according to the repeated mapping pattern.

4. The operating method of claim 1, wherein mapping each bit of the code word onto a specific bit of multi-bit data of the nonvolatile memory device comprises mapping each bit of the code word onto a least significant bit, a central significant bit, or a most significant bit according to the repeated mapping pattern.

5. The operating method of claim 1, further comprising transferring by the memory controller a mapped code word as multi-bit write data to the nonvolatile memory device.

6. The operating method of claim 5, further comprising:
   receiving by the memory controller multi-bit read data from the nonvolatile memory device;
   convening by the memory controller the multi-bit read data into a read code word based upon the repeated mapping pattern; and
   decoding by the memory controller the read code word.

7. The operating method of claim 1, further comprising:
   performing by the memory controller error correction encoding on a mapped code word; and
   transferring by the memory controller an encoded code word as multi-bit write data to the nonvolatile memory device.

8. The operating method of claim 7, further comprising:
   receiving by the memory controller multi-bit read data from the nonvolatile memory device;
   performing by the memory controller error correction decoding on the multi-bit read data;
   converting by the memory controller decoded multi-bit read data into a read code word based upon the repeated mapping pattern; and
   decoding by the memory controller the read code word.

* * * * *